(12) United States Patent
Horng

(10) Patent No.: US 7,616,441 B2
(45) Date of Patent: Nov. 10, 2009

(54) GRAPHITE HEAT DISSIPATION APPARATUS AND CLAMPING FRAME FOR CLAMPING GRAPHITE HEAT DISSIPATION FIN MODULE

(76) Inventor: Chin-Fu Horng, 4F, No. 282, Chung San First Rd., Taipei Hsien (TW)

( * ) Notice: Subject to any disclaimer, the term of this patent is extended or adjusted under 35 U.S.C. 154(b) by 54 days.

(21) Appl. No.: 11/941,462

(22) Filed: Nov. 16, 2007

(65) Prior Publication Data
US 2009/0040719 A1 Feb. 12, 2009

(30) Foreign Application Priority Data
Aug. 6, 2007 (TW) .............................. 96212857 U

(51) Int. Cl.
*H05K 7/20* (2006.01)
*H01L 23/467* (2006.01)
(52) U.S. Cl. ............ 361/697; 361/695; 361/696; 361/704; 361/710; 361/719; 165/80.3; 165/104.33; 165/104.34
(58) Field of Classification Search ............ 361/687, 361/690–697, 699–712, 714–719; 174/15.1, 174/16.3, 252; 257/706–727; 428/408; 165/80.3, 165/121, 122, 104.33, 185; 24/295, 296, 24/451, 453, 457, 458, 505, 510
See application file for complete search history.

(56) References Cited

U.S. PATENT DOCUMENTS

| | | | |
|---|---|---|---|
| 6,503,626 B1 * | 1/2003 | Norley et al. | 428/408 |
| 6,758,263 B2 * | 7/2004 | Krassowski et al. | 165/185 |
| 6,832,410 B2 * | 12/2004 | Hegde | 165/80.3 |
| 6,841,250 B2 * | 1/2005 | Tzeng | 428/408 |
| 7,108,055 B2 * | 9/2006 | Krassowski et al. | 165/185 |

FOREIGN PATENT DOCUMENTS

| | | | |
|---|---|---|---|
| JP | 02003060140 A | * | 2/2003 |
| JP | 02006100379 A | * | 4/2006 |

* cited by examiner

*Primary Examiner*—Michael V Datskovskiy
(74) *Attorney, Agent, or Firm*—Rosenberg, Klein & Lee

(57) ABSTRACT

A graphite heat dissipation apparatus and a clamping frame for clamping a graphite heat dissipation fin module are provided. The graphite heat dissipation apparatus includes a graphite heat dissipation fin module and at least one clamping frame. The graphite heat dissipation fin module includes a substrate and a plurality of graphite fins which are positioned at and extend from one surface of the substrate. The clamping frame includes at least one support bracket, at least one retention plates and a frame body. The support brackets are positioned at top surface of a chassis. The frame body upwardly extends from the support brackets, and the retention plates traverse extend across the side surface of the frame body. The retention plates are used to clamp the substrate so that the graphite fins are positioned above the chassis. The graphite heat dissipation fin module is used to draw hear away from the electronic device which can be positioned below the substrate and at the surface of the chassis.

19 Claims, 5 Drawing Sheets

GRAPHITE HEAT DISSIPATION APPARATUS AND CLAMPING FRAME FOR CLAMPING GRAPHITE HEAT DISSIPATION FIN MODULE

BACKGROUND OF THE INVENTION

1. Field of the Invention

The present invention relates to a graphite heat dissipation apparatus, and in particular to a clamping frame for clamping a graphite heat dissipation fin module.

2. Description of Related Art

Please refer to FIG. 1 which illustrates a graphite heat dissipation apparatus 2 in prior art. As shown in FIG. 1, the graphite heat dissipation apparatus 2 draws heat away from an electronic device 6 such as processor or chipset which generates heat by a graphite heat dissipation fin module 4. The electronic device 6 is installed on the surface of a chassis 8 such as a printed circuit board. The graphite heat dissipation fin module 4 is attached to the top of the electronic device 6 to carry heat away from the electronic device 6. The graphite heat dissipation apparatus 2 is usually apparent at personal computers or servers and a much more advanced cooling method.

Furthermore, the graphite heat dissipation apparatus 2 also includes a metallic frame 10 and a metallic enclosure 12. The graphite heat dissipation fin module 4 includes a graphite substrate 402 and a plurality of graphite fins 404 extending from its surface. And, the graphite heat dissipation fin module 4 is soft so that it is prone to be damaged. Further referring to FIG. 1, the he graphite heat dissipation fin module 4 is positioned at the metallic frame 10, and the metallic frame 10 has a central hole 1002. The electronic device 6 protrudes through the central hole 1002 so the electronic device 6 is attached to the bottom surface of the graphite substrate 402 of the graphite heat dissipation fin module 4.

Furthermore, the metallic enclosure 12 is used to cover the graphite heat dissipation fin module 4 which is placed at the metallic frame 10 so that the graphite heat dissipation fin module 4 is protected and prevented from being damaged due to inadvertent collision.

However, the graphite heat dissipation apparatus 2 can prevent the graphite heat dissipation fin module 4 from being damaged, but the metallic frame 10 and the metallic enclosure 12 do not aid in dissipating heat. Then, dissipation efficiency is significantly decreased. Cost is higher and product is not so competitive as others in the market because too much material and many components are utilized in the metallic frame 10 and the metallic enclosure 12.

Thus, there is a need for a graphite heat dissipation apparatus and a clamping frame for clamping a graphite heat dissipation fin module to improve disadvantages in prior art.

SUMMARY OF THE INVENTION

It is an object of the present invention to provide a graphite heat dissipation apparatus and a clamping frame for clamping a graphite heat dissipation fin module. In addition to improve dissipation efficiency, cost of the graphite heat dissipation apparatus is significantly decreased without the expense of fundamental capability of the graphite heat dissipation fin module.

The present invention relates to a graphite heat dissipation apparatus and a clamping frame for clamping a graphite heat dissipation fin module. The graphite heat dissipation apparatus includes a graphite heat dissipation fin module and at least one clamping frame.

The graphite heat dissipation fin module includes a substrate and a plurality of graphite fins which are positioned at and extend from one surface of the substrate.

The clamping frame includes at least one support bracket, at least one retention plates and a frame body. The support brackets are positioned at top surface of a chassis. The frame body upwardly extends from the support brackets, and the retention plates extend traverse across the side surface of the frame body. The retention plates are used to clamp the substrate so that the graphite fins are positioned above the chassis.

Furthermore, there is a clearance between the bottoms of the support brackets and the retention plates so that an electronic device is received in the clearance and accommodated between the substrate and the chassis. In addition, the clamping frame is manufactured by metal punch process or is integrally made of plastic.

With the graphite heat dissipation apparatus and the clamping frame for clamping a graphite heat dissipation fin module, heat dissipation efficiency is significantly increased due to the inventive design of the clamping frame. Moreover, the clamping frame is made of easily available material and simple structure so cost is significantly decreased without the expense of fundamental capability of the clamping frame for protecting the graphite heat dissipation fin module.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
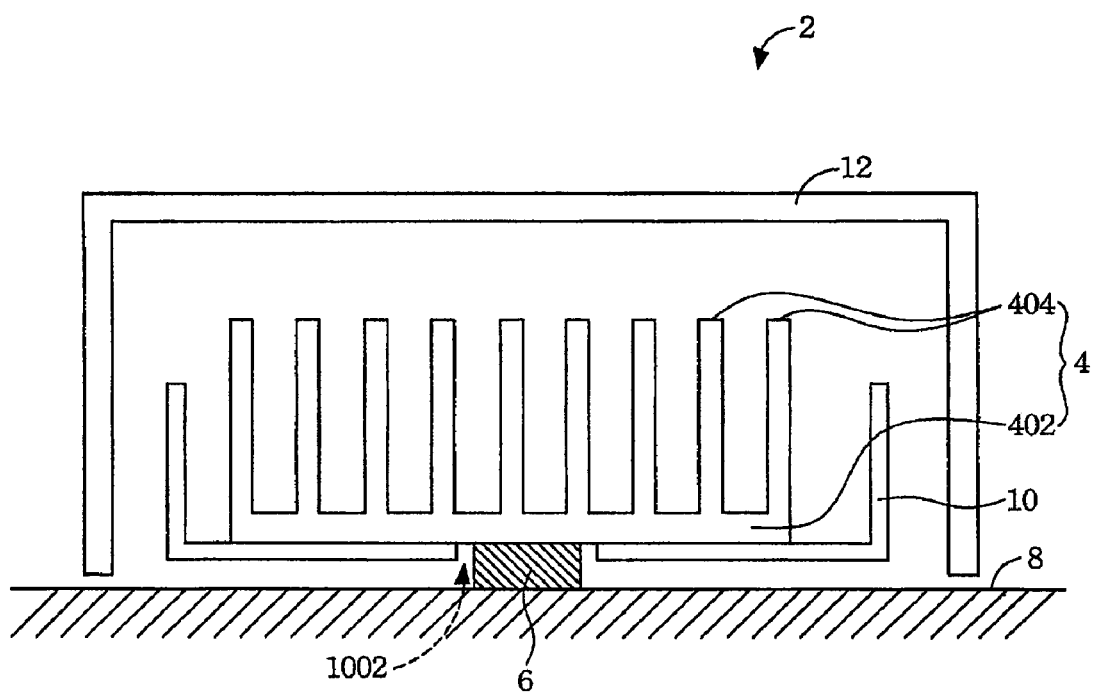
FIG. 1 is a side elevational view of a graphite heat dissipation apparatus in prior art.
Figure 2:
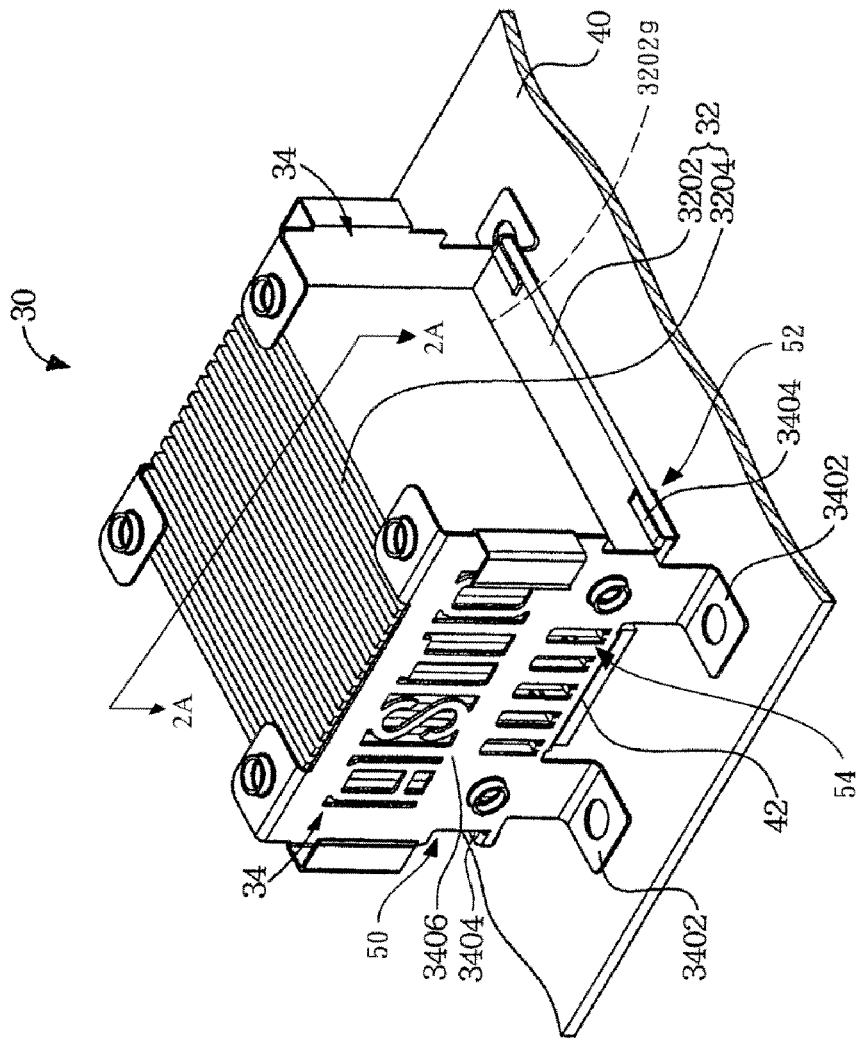
FIG. 2 is a perspective view of a graphite heat dissipation apparatus of the present invention.
Figure 2A:
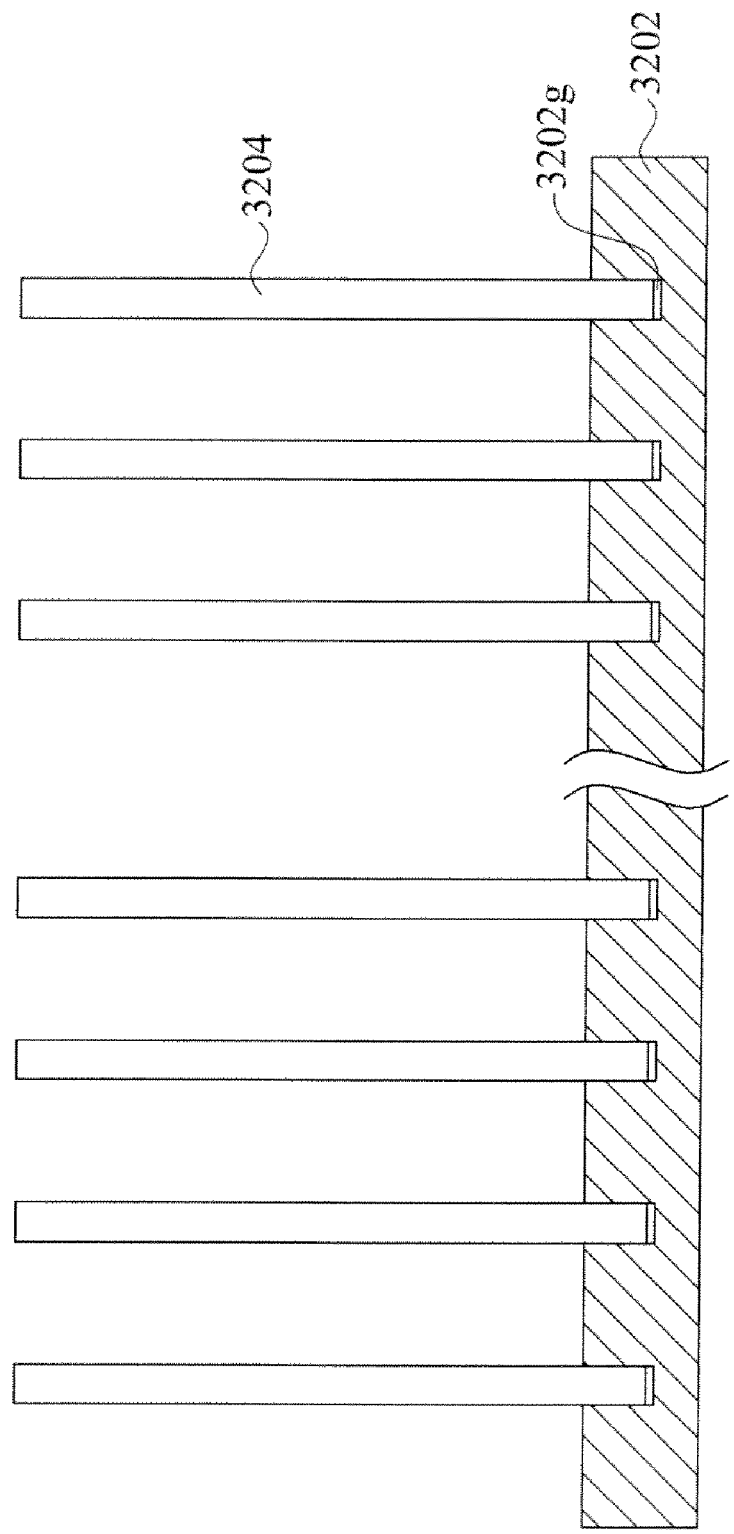
FIG. 2A is cross-sectional view of a graphite heat dissipation apparatus taken along the section line 2A-2A in FIG. 2.

Please refer to FIGS. 2 and 2A which respectively illustrate a perspective view and a cross sectional view of a graphite heat dissipation apparatus 30 of the present invention. The present invention relates to the graphite heat dissipation apparatus 30 and at least one clamping frame 34 for clamping a graphite heat dissipation fin module 32. The graphite heat dissipation apparatus 30 includes the graphite heat dissipation fin module 32 and at least one clamping frame 34.

The graphite heat dissipation fin module 32 includes a substrate 3202 and a plurality of graphite fins 3204. The graphite fins 3204 are positioned at one surface of the substrate 3202, and the substrate 3202 can be made of but not limited to any conductive material, graphite substrate or metallic plate. In accordance with the present invention, the clamping frames 34 advantageously aid in stabilizing the substrate which is made of soft graphite.

Specifically, there is also a plurality of grooves 3202g (as shown in FIG. 2A) on the top surface of the substrate 3202, and the graphite fins 3204 are inserted into the grooves 3202g and positioned at the top surface of the substrate 3202 so that the graphite heat dissipation fin module 32 is formed.

According to an embodiment of the present invention, the graphite heat dissipation apparatus 30 has two clamping frames 34 which are symmetrically positioned so as to hold the substrate 3202 between two opposite sides of the graphite heat dissipation fin module 32. In this light, the graphite heat dissipation fin module 32 is more held firmly in place and well protected.

The clamping frames 34 include at least one support bracket 3402, at least one retention plate 3404 and a frame body 3406. Referring to FIG. 2, each of the clamping frames 34 has two support brackets 3402 which are positioned at a top surface of a chassis 40. The frame body 3406 extends upwardly from the support brackets 3402, and the retention plates 3404 extend traverse across the side surface of the frame body 3406. The retention plates 3404 are used to clamp the substrate 3202 so that the graphite heat dissipation fin module 32 is positioned above the chassis 40.

The chassis 40 is not limited to specific material as well known in the electronic industry, and the electronic device 42 such as a printed circuit board can be positioned at the surface of the chassis 40. In addition, the electronic device 42 includes processor or chipset etc. which generate heat.

Figure 3:
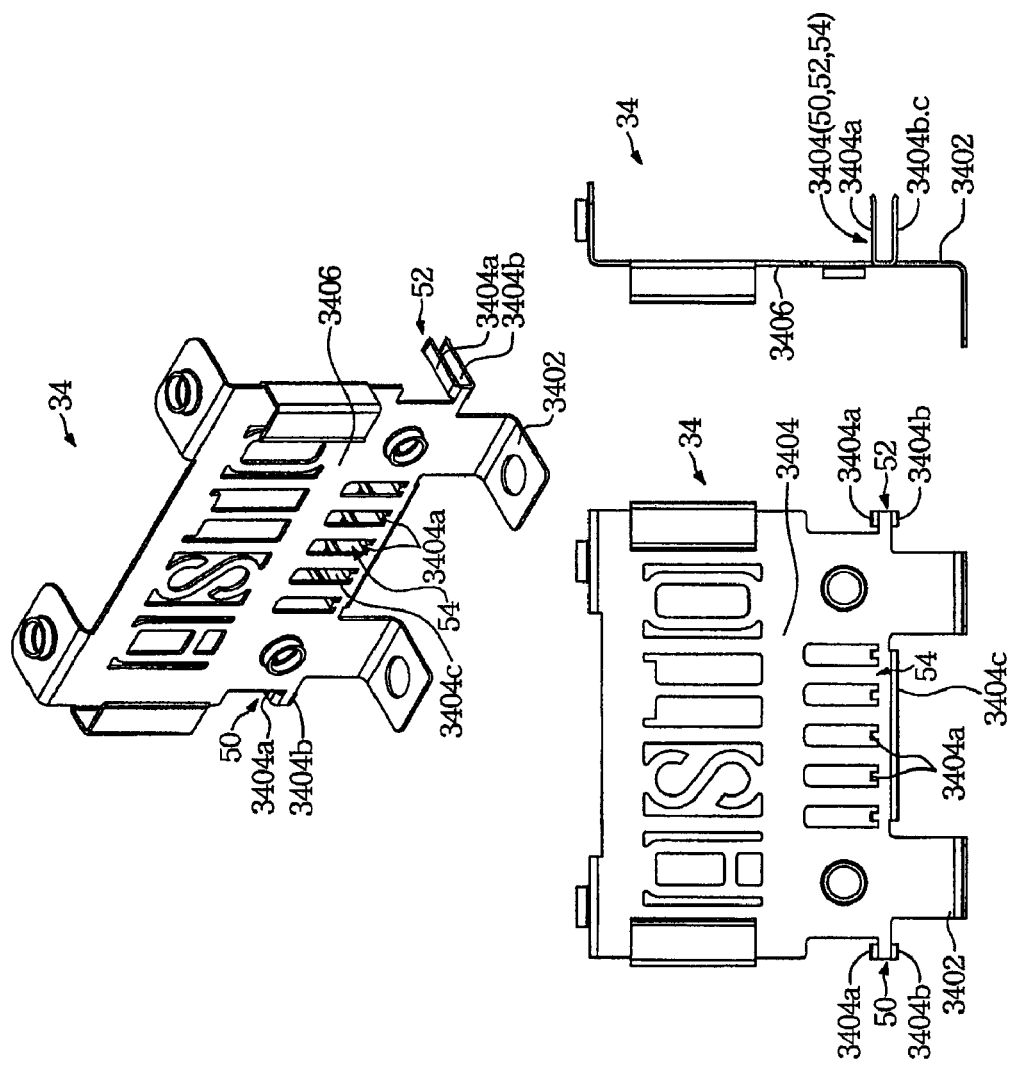
FIG. 3 is a perspective view, a side elevational view and a front plan view of the clamping frame according to the present invention.

Please refer to FIG. 3 illustrating a perspective view, a side view and a plane view of the clamping frames 34. The graphite fins 3204 are separately positioned at and extend from the top surface of the substrate 3202. Each of the retention plates 3404 includes a left retention clip 50, a right retention clip 52 and a central retention clip 54.

The left retention clip 50 and the right retention clip 52 are respectively positioned at two corresponding sides of the frame body 3406 and respectively include upper fingers 3404a and lower fingers 3404b. The upper fingers 3404a and the lower fingers 3404b are used to clamp the substrate 3202. The central retention clip 54 is positioned between the left retention clip 50 and the right retention clip 52 and includes a plurality of upper fingers 3404a and a lower supporting plate 3404c. The upper fingers 3404a of the central retention clip 54 are inserted to clearances between adjacent graphite fins 3204 so that the upper fingers 3404a and the lower supporting plate 3404c are used to clamp the substrate 3202.

Further referring to FIG. 2, there is a clearance between the bottoms of the support brackets 3402 and the retention plates 3404 so that the electronic device 42 is accommodated between the substrate 3202 and the chassis 40. Preferably, the bottom of the substrate 3202 is attached to the top surface of the electronic device 42. In addition, the clamping frame 34 is manufactured by metal punch process or is integrally made of plastic. The graphite heat dissipation fin module 32 is more held firmly in place by the clamping frame 34 and is used to aid in dissipating heat generated by the electronic device 42.

Figure 4:
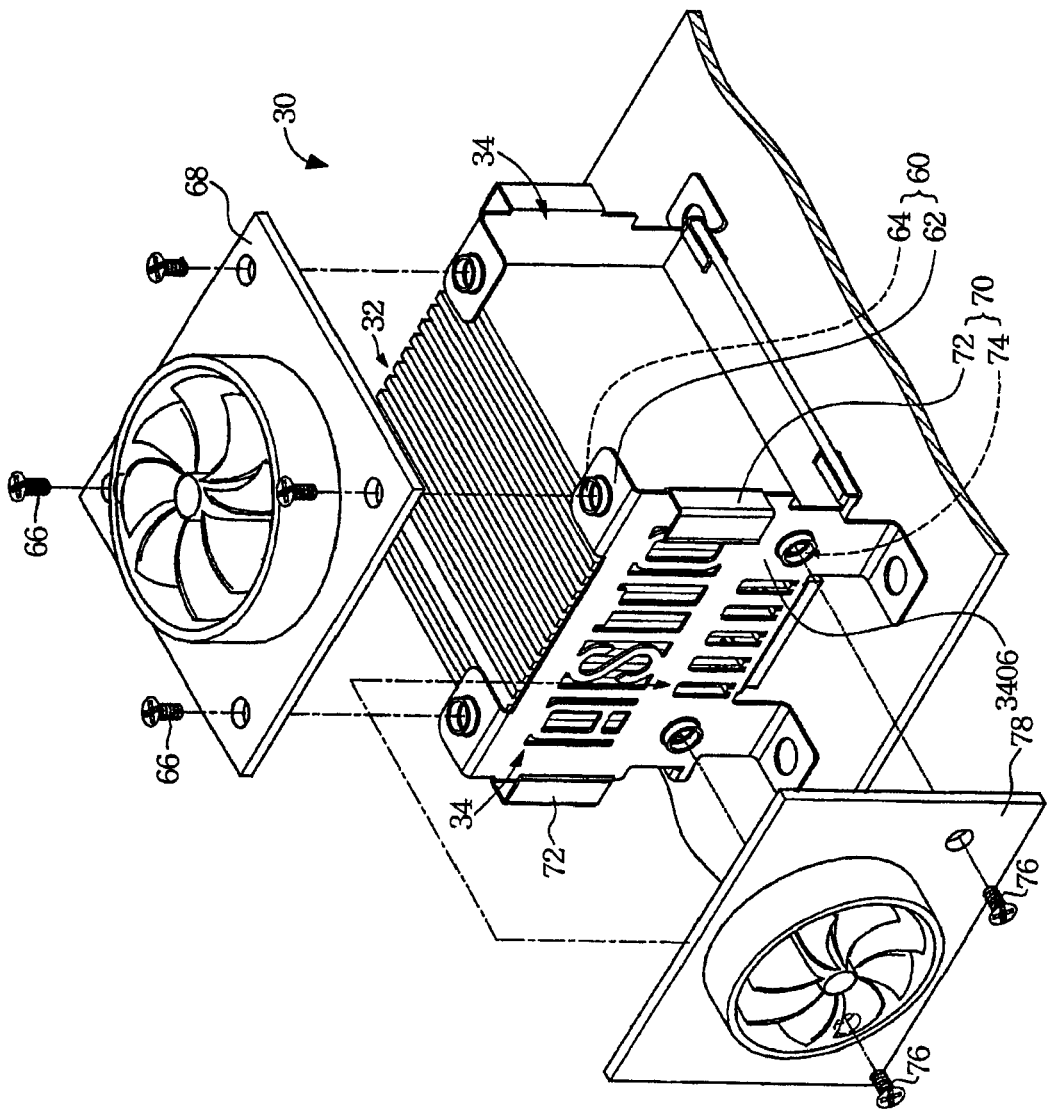
FIG. 4 is a perspective view of the graphite heat dissipation apparatus with electrical fans of the present invention.

Please refer to FIG. 4 illustrating a perspective view of the graphite heat dissipation apparatus 30 with electrical fans. As described above, the graphite heat dissipation apparatus 30 further includes a first heat sink 60 and a second heat sink 70.

The first heat sink 60 includes at least one support frame 62 and first through holes 64 defined at the support frames 62. As shown in FIG. 4, the support frame 62 inwardly extends from the edge of the top of the clamping frame 34 and is positioned above the graphite heat dissipation fin module 32. Four first fasteners 66 are respectively inserted into four through holes 64 of the support frames 62 so as to secure a first electrical fan 68 at the first heat sink 60.

The frame body 3406 is porous so that air is allowed to flow through the frame body 3406. The second heat sink 70 includes a pair of L-shaped guide hooks 72 and a pair of second through holes 74 defined at the frame body 3406. The L-shaped guide hooks 72 extend from the surface of the frame body 3406 and inwardly extend from the edge of the frame body 3406 so that a traverse guide rail is formed to guide a second electrical fan 78. Two second fasteners 76 are respectively inserted into second through holes 74 of the clamping frame 34 so as to secure the second electrical fan 78 at the second heat sink 70. With the first electrical fan 68 and the second electrical fan 78, airflow near the graphite heat dissipation fin module 32 is forced to flow faster.

With the graphite heat dissipation apparatus 30 and the clamping frame 34 for clamping the graphite heat dissipation fin module 32, heat dissipation efficiency is significantly increased due to the inventive design of the clamping frame 34. Moreover, the clamping frame 34 is made of available material and simple structure so cost is significantly decreased without the expense of fundamental capability of the clamping frame 34 for protecting the graphite heat dissipation fin module 32.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. A graphite heat dissipation apparatus, comprising:
    a graphite heat dissipation fin module including a substrate and a plurality of graphite fins positioned at one surface of the substrate; and
    a clamping frame including at least one support bracket, at least one retention plate and a frame body, the support bracket being fixed at top surface of a chassis, the frame body upwardly extending from the support bracket and the retention plate extending traverse across the side surface of the frame body, the retention plate being used to clamp the substrate so that the graphite heat dissipation fin module is positioned above the chassis.

2. The graphite heat dissipation apparatus as claimed in claim 1, wherein the substrate is a graphite substrate.

3. The graphite heat dissipation apparatus as claimed in claim 1, wherein the graphite fins are separately positioned at and extend from the top surface of the substrate, the retention plate including a left retention clip, a right retention clip and a central retention clip, the left retention clip and the right retention clip being respectively positioned at two corresponding sides of the frame body and respectively including upper fingers and lower fingers, and wherein the upper fingers and the lower fingers are used to clamp the substrate and the central retention clip is positioned between the left retention clip and the right retention clip and includes a plurality of upper fingers and a lower supporting plate, and the upper fingers of the central retention clip are inserted into clearances between adjacent graphite fins so that the upper fingers and the lower supporting plate are used to clamp the substrate.

4. The graphite heat dissipation apparatus as claimed in claim 1, wherein the graphite fins are inserted into grooves on the top surface of the substrate.

5. The graphite heat dissipation apparatus as claimed in claim 1, further comprising a first heat sink including at least one support frame and first through holes defined at the support frame, and the support frame inwardly extends from the edge of the top of the clamping frame and is positioned above the graphite heat dissipation fin module, and at least one fastener is inserted into the first through holes of the support frame to secure a first electrical fan at the first heat sink.

6. The graphite heat dissipation apparatus as claimed in claim 5, wherein the frame body is porous and the graphite heat dissipation apparatus further comprises a second heat sink including a pair of L-shaped guide hooks and a pair of second through holes defined at the support frame, and the L-shaped guide hooks extend from the surface of the frame body and inwardly extend from the edge of the frame body to guide a second electrical fan, two second fasteners are respectively inserted into second through holes of the support frame to secure a second electrical fan at the second heat sink.

7. The graphite heat dissipation apparatus as claimed in claim 1, wherein there is a clearance between the bottom of the support bracket and the retention plate so that an electronic device is accommodated between the substrate and the chassis.

8. The graphite heat dissipation apparatus as claimed in claim 1, wherein the graphite heat dissipation apparatus has two of the clamping frames which are symmetrically positioned to hold the substrate in place between two opposite sides of the graphite heat dissipation fin module.

9. The graphite heat dissipation apparatus as claimed in claim 1, wherein the clamping frame is manufactured by metal punch process.

10. The graphite heat dissipation apparatus as claimed in claim 1, wherein the clamping frame is integrally made of plastic.

11. A clamping frame for clamping a graphite heat dissipation fin module of a heat dissipation apparatus at a top surface of a chassis, the graphite heat dissipation fin module including a substrate and a plurality of graphite fins which are positioned at one surface of the substrate, the clamping frame comprising:
   at least one support bracket positioned at the top surface of the chassis;
   a frame body upwardly extending from the support bracket; and
   at least one retention plate traverse extending across the side surface of the frame body, and used to clamp the substrate so that the graphite fins are positioned above the device.

12. The clamping frame as claimed in claim 11, wherein the substrate is a graphite substrate.

13. The clamping frame as claimed in claim 11, wherein the graphite fins are separately positioned at and extend from the top surface of the substrate, the retention plate including a left retention clip, a right retention clip and a central retention clip, the left retention clip and the right retention clip being respectively positioned at two corresponding sides of the frame body and respectively including upper fingers and lower fingers, the upper fingers and the lower fingers being used to clamp the substrate, the central retention clip being positioned between the left retention clip and the right retention clip and including a plurality of upper fingers and a lower supporting plate, and the upper fingers of the central retention clip being inserted to clearances between adjacent graphite fins so that the upper fingers and the lower supporting plate are used to clamp the substrate.

14. The clamping frame as claimed in claim 11, wherein the graphite fins are inserted into a plurality of grooves of the top surface of the substrate.

15. The clamping frame as claimed in claim 11, wherein the heat dissipation apparatus further includes a first heat sink and a second heat sink, and the first heat sink being positioned above the graphite heat dissipation fin module and further comprising at least one first through hole, first fasteners being inserted into the through holes to secure a first electrical fan at the first heat sink.

16. The clamping frame as claimed in claim 15, wherein the frame body is porous, and the heat dissipation apparatus further including a second heat sink which includes a pair of L-shaped guide hooks and a pair of second through holes defined at the frame body, the L-shaped guide hooks extend from the surface of the frame body and inwardly extend from the edge of the frame body so that a traverse guide rail is formed to guide a second electrical fan, two second fasteners being respectively inserted into second through holes of the support frame to secure the second electrical fan at the second heat sink.

17. The clamping frame as claimed in claim 11, wherein there is a clearance between the bottom of the support bracket and the retention plate so that the electronic device is accommodated between the substrate and the chassis.

18. The clamping frame as claimed in claim 11, wherein the clamping frame is manufactured by metal punch process.

19. The clamping frame as claimed in claim 11, wherein the clamping frame is integrally made of plastic.

* * * * *